United States Patent
Lu et al.

(10) Patent No.: US 10,424,539 B2
(45) Date of Patent: Sep. 24, 2019

(54) WIRING STRUCTURE, SEMICONDUCTOR PACKAGE STRUCTURE AND SEMICONDUCTOR PROCESS

(71) Applicant: Advanced Semiconductor Engineering, Inc., Kaohsiung (TW)

(72) Inventors: Wen-Long Lu, Kaohsiung (TW); Ching Kuo Hsu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 364 days.

(21) Appl. No.: 15/387,018

(22) Filed: Dec. 21, 2016

(65) Prior Publication Data

US 2018/0174954 A1    Jun. 21, 2018

(51) Int. Cl.
*H01L 23/522*    (2006.01)
*H01L 23/498*    (2006.01)
(Continued)

(52) U.S. Cl.
CPC ...... *H01L 23/49838* (2013.01); *H01L 21/486* (2013.01); *H01L 21/4857* (2013.01); *H01L 23/3135* (2013.01); *H01L 23/3142* (2013.01); *H01L 23/49822* (2013.01); *H01L 23/49827* (2013.01); *H01L 23/49894* (2013.01); *H01L 24/17* (2013.01); *H01L 23/3128* (2013.01); *H01L 24/13* (2013.01); *H01L 24/16* (2013.01); *H01L 24/32* (2013.01); *H01L 24/81* (2013.01); *H01L 24/83* (2013.01); *H01L 24/92* (2013.01); *H01L 24/97* (2013.01); *H01L 2224/131* (2013.01); *H01L 2224/13082* (2013.01); *H01L 2224/16113* (2013.01); *H01L 2224/16227* (2013.01); *H01L 2224/16238* (2013.01); *H01L 2224/32225* (2013.01); *H01L 2224/73204* (2013.01); *H01L 2224/81191* (2013.01); *H01L 2224/81439* (2013.01); *H01L 2224/81444* (2013.01); *H01L 2224/81801* (2013.01);
(Continued)

(58) Field of Classification Search
CPC . H01L 23/3135; H01L 23/522; H01L 23/528; H01L 23/642; H01L 23/535; H01L 23/538; H01L 23/5329; H01L 23/53295; H01L 23/5226; H01L 23/5386; H01L 29/78687; H01L 29/4958
USPC ........................................................ 257/668
See application file for complete search history.

(56) References Cited

U.S. PATENT DOCUMENTS

2006/0068337 A1*  3/2006  Tanouchi .............. G03F 7/3021
                                                      430/464
2009/0241332 A1* 10/2009  Lauffer .................. H05K 3/462
                                                       29/829

(Continued)

*Primary Examiner* — Chuong A Luu
(74) *Attorney, Agent, or Firm* — Foley & Lardner LLP; Cliff Z. Liu

(57) ABSTRACT

A wiring structure includes a main body, a first dielectric layer, a first circuit layer and a second dielectric layer. The first dielectric layer is disposed on the main body, and defines a plurality of first grooves and at least one receiving portion between two first grooves. The first circuit layer is disposed on the first dielectric layer, and includes at least one first conductive trace disposed on the receiving portion. A width of the first conductive trace is less than a width of the receiving portion. A second dielectric layer disposed on the first dielectric layer, and extends into the first grooves.

19 Claims, 17 Drawing Sheets

(51) Int. Cl.
- *H01L 23/00* (2006.01)
- *H01L 21/48* (2006.01)
- *H01L 23/31* (2006.01)

(52) U.S. Cl.
CPC .............. *H01L 2224/83104* (2013.01); *H01L 2224/92125* (2013.01); *H01L 2224/97* (2013.01); *H01L 2924/0105* (2013.01); *H01L 2924/01028* (2013.01); *H01L 2924/01029* (2013.01); *H01L 2924/01079* (2013.01); *H01L 2924/0665* (2013.01); *H01L 2924/07025* (2013.01); *H01L 2924/1511* (2013.01); *H01L 2924/15311* (2013.01); *H01L 2924/181* (2013.01); *H01L 2924/18161* (2013.01)

(56) References Cited

U.S. PATENT DOCUMENTS

| | | | |
|---|---|---|---|
| 2014/0293208 A1* | 10/2014 | Kanbayashi | G02F 1/133502 349/138 |
| 2016/0066423 A1 | 3/2016 | Sakamoto et al. | |
| 2018/0237934 A1* | 8/2018 | Furutani | H05K 3/4632 |

* cited by examiner

WIRING STRUCTURE, SEMICONDUCTOR PACKAGE STRUCTURE AND SEMICONDUCTOR PROCESS

BACKGROUND

1. Field of the Disclosure

The present disclosure relates to a wiring structure, a semiconductor package structure and a semiconductor process, and more particularly to a wiring structure having a teeth-shaped dielectric layer and a method for manufacturing the same.

2. Description of the Related Art

Along with the rapid development of electronic industries and the progress of semiconductor processing technologies, semiconductor chips are integrated with ever more electronic components to achieve improved electrical performance. Accordingly, the semiconductor chips are provided with more input/output (I/O) connections. To achieve semiconductor packages that include semiconductor chips with increasing numbers of I/O connections, sizes of the semiconductor chips and the semiconductor packages may correspondingly increase. Thus, a cost of manufacture may correspondingly increase. Alternatively, to miniaturize semiconductor package size while using semiconductor chips with increased numbers of I/O connections, a density of circuit layers of semiconductor substrates used for carrying the semiconductor chips may correspondingly increase. That is, a line width/line space (L/S) of the circuit layer may be reduced, thus reducing a pitch between traces. Therefore, a width of a portion of a photoresist layer between two traces may be reduced. However, peeling due to such small width of the photoresist layer can be an issue of concern. The photoresist layer may be thin and may readily peel off due to, for example, a small surface area for bonding or adhesion, especially when the L/S of the pattern of the photoresist layer is very small, such as less than about 2 μm/about 2 μm.

SUMMARY

In some embodiments, according to one aspect, a wiring structure includes a main body, a first dielectric layer, a first circuit layer and a second dielectric layer. The first dielectric layer is disposed on the main body, and defines a plurality of first grooves and at least one receiving portion between two first grooves. The first circuit layer is disposed on the first dielectric layer, and includes at least one first conductive trace disposed on the receiving portion. A width of the first conductive trace is less than a width of the receiving portion. A second dielectric layer disposed on the first dielectric layer, and extends into the first grooves.

In some embodiments, according to another aspect, a semiconductor package structure includes a wiring structure and a semiconductor die. The wiring structure includes a main body, a first dielectric layer, a first circuit layer and a second dielectric layer. The first dielectric layer is disposed on the main body, and defines a plurality of first grooves and at least one receiving portion between two first grooves. The first circuit layer is disposed on the first dielectric layer, and includes at least one first conductive trace disposed on the receiving portion. A width of the first conductive trace is less than a width of the receiving portion. A second dielectric layer is disposed on the first dielectric layer, and extends into the first grooves. The semiconductor die is disposed on and electrically connected to the wiring structure.

In some embodiments, according to another aspect, a semiconductor manufacturing process includes: (a) forming a first dielectric layer on a main body; (b) forming a plurality of first grooves on the first dielectric layer; (c) forming an intermediate layer on the first dielectric layer and in the first grooves; (d) removing a portion of the intermediate layer to form a pattern which includes at least one first opening; (e) forming a metal material in the first opening of the pattern of the intermediate layer; and (f) removing the intermediate layer to form a first circuit layer.

DETAILED DESCRIPTION

Figure 1:
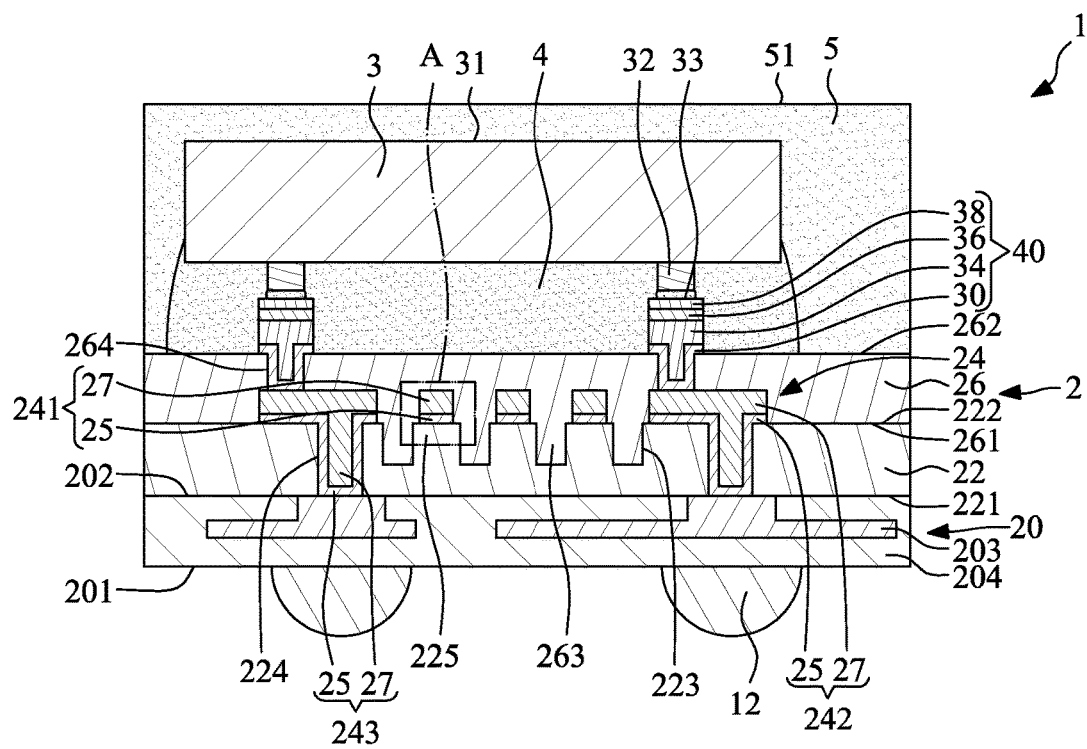
FIG. 1 illustrates a cross-sectional view of a semiconductor package structure according to some embodiments of the present disclosure.

The present disclosure provides an improved wiring structure with a teeth-shaped dielectric layer, a semiconductor package structure including the same and improved techniques for manufacturing the wiring structure. The wiring structure and techniques described in the present disclosure are suitable for high resolution trace fabrication.

A manufacturing process of making a conductive circuit layer may begin with forming a photoresist layer on a base material, followed by patterning the photoresist layer by lithography to form a plurality of openings, and then plating a metal material in the openings of the photoresist layer to form the conductive circuit layer. However, during the manufacturing process, if the L/S of the pattern of the photoresist layer is very small (e.g., less than about 2 μm/about 2 μm), portions of the photoresist layer will be thin and may readily peel off from the dielectric layer. Such peeling can make it difficult to form the conductive circuit layer. Additionally, the roughness of the surface of the base material can affect a resolution of the lithography. As a result, for example, a bottom portion of the photoresist layer may be removed in excess of a desired amount by the lithography (which is referred to herein as "undercut"). Thus, a width of a bottom portion of the photoresist layer may be less than a width of a top portion of the photoresist layer. When the bonding area between the photoresist layer and the base material is reduced and the photoresist layer is undercut, the photoresist layer may be unsteadily disposed on the base material.

To address such concerns, some solutions can be implemented. One solution is to increase the surface roughness of the surface of the base material. Larger surface roughness will increase the bonding force between the photoresist layer and the base material. However, if the surface roughness of the surface of the base material is too large, the stability of the conductive circuit layer plated on the base material may become an issue. For example, if a width of a conductive trace of the conductive circuit layer is 2 μm, and the surface roughness is greater than 0.1 μm (e.g. the surface has bumps or ridges that are greater than 0.1 μm across), the conductive trace may not stand on the base material securely. In addition, additional processing may be needed to generate such surface roughness, which can increase the manufacture cost and risk of manufacturing failure.

A second solution is to change a material property of the photoresist layer. For example, the molecular structure of the photoresist layer can be changed to increase the bonding force between the photoresist layer and the base material. However, the metal plating solution during the following process may also then require adjustment. Thus, additional processing may be needed to achieve such changes, which can increase the manufacture cost and risk of manufacturing failure.

The present disclosure addresses at least the above concerns and provides an improved wiring structure and improved techniques for manufacturing the wiring structure. In one or more embodiments of the present disclosure, portions of the photoresist layer are inserted or disposed in the grooves of the base material. Thus, the photoresist layer may have "teeth" (e.g. extending portions) extending toward the base material. Therefore, the bonding area and bonding force between the photoresist layer and the base material are increased. As a result, the photoresist layer will not readily peel off, even if the L/S of the pattern of the photoresist layer is very small, such as less than about 2 μm/about 2 μm. Thus, the conductive trace of the plated conductive circuit layer can stand on the base material securely even if a width of a conductive trace of the conductive circuit layer is small, such as about 2 μm. Further, if undercut occurs during a lithography process, the photoresist layer can still stand on the base material firmly. In addition, the surface roughness of the surface of the base material will have less influence on the stability of the conductive circuit layer plated on the base material. Thus, the undercut and the surface condition of the base material will not prevent manufacture of a precise and finely patterned conductive circuit layer (including the traces and the bump pads). The traces and the bump pads can be formed concurrently by high resolution techniques. Thus, the conductive circuit layer can be produced with a small L/S, such as an L/S of about 2 μm/about 2 μm or less. The conductive circuit layer can also be produced in this manner with an L/S greater than about 2 μm/about 2 μm, such as about 5 μm/about 5 μm, about 10 μm/about 10 μm, greater than about 10 μm/about 10 μm, or any L/S therebetween.

FIG. 1 illustrates a cross-sectional view of a semiconductor package structure 1 according to some embodiments of the present disclosure. The semiconductor package structure 1 includes a wiring structure 2, a semiconductor die 3, an underfill 4, an encapsulant 5 and a plurality of external connection elements 12.

The wiring structure 2 includes a main body 20 (e.g., a substrate), a first dielectric layer 22, a first circuit layer 24, a second dielectric layer 26 and a plurality of bump pads 40. The main body 20 includes a first surface 201, a second surface 202 opposite to the first surface 201, and a conductive structure 203 embedded in a dielectric structure 204. A portion of the conductive structure 203 is exposed from the second surface 202 of the main body 20. The L/S of the conductive structure 203 may be, for example, greater than about 5 μm/about 5 μm.

The first dielectric layer 22 may be, for example, a passivation layer or a solder mask layer. In some embodiments, the first dielectric layer 22 may include, or be formed from, a cured photoimageable dielectric (PID) material such as epoxy or polyimide (PI) including photoinitiators. The first dielectric layer 22 has a first surface 221 and a second surface 222 opposite to the first surface 221, and defines a plurality of first grooves 223, at least one second groove 224 and at least one receiving portion 225 between two first grooves 223. The first surface 221 of the first dielectric layer 22 is disposed on the second surface 202 of the main body 20. The first grooves 223 are recesses from the second surface 222 of the first dielectric layer 22, and do not penetrate fully through the first dielectric layer 22. An aspect ratio of the first groove 223 may be greater than about 0.1, for example. For example, if a width of the first groove 223 is 2 μm, the depth of the first groove 223 can be greater than 0.2 μm. In one or more embodiments, a depth of the first groove 223 may be greater than ¼, ⅓ or ½ of a thickness of the first dielectric layer 22, or any number therebetween. In addition, the second groove 224 extends fully through the first dielectric layer 22, and corresponds to the exposed portion of the conductive structure 203.

The first circuit layer 24 is disposed on the second surface 222 of the first dielectric layer 22, and includes at least one first conductive trace 241, at least one first pad 242 and at least one first conductive via 243. The first conductive trace 241 is disposed on the receiving portion 225. As shown in FIG. 1, the first conductive trace 241 includes a metal material 27 (e.g., copper) and a seed layer 25. The seed layer 25 is disposed on the receiving portion 225, and the metal material 27 is disposed on the seed layer 25. A L/S of the first conductive trace 241 may be less than about 2 μm/about 2 μm. The first pad 242 is disposed on the second surface 222 of the first dielectric layer 22 and above the second groove 224, and includes the metal material 27 and the seed layer 25. The first conductive via 243 is disposed in the second groove 224, and physically and electrically connects the first pad 242 and a portion of the conductive structure 203 of the main body 20. In one or more embodiments, the first conductive trace 241, the first pad 242 and the first conductive via 243 are formed concurrently.

The second dielectric layer 26 may be, for example, a passivation layer or a solder mask layer. In some embodiments, the second dielectric layer 26 may include, or be formed from, a cured PID material such as epoxy or PI including photoinitiators. The material of the second dielectric layer 26 may be the same as or different from the material of the first dielectric layer 22. The second dielectric layer 26 is disposed on the first dielectric layer 22 and covers the first conductive trace 241 and the first pad 242 of the first circuit layer 24, and extends into the first grooves 223 of the first dielectric layer 22. The second dielectric layer 26 has a first surface 261, a second surface 262 opposite to the first surface 261 and a plurality of extending portions 263, and defines a plurality of openings 264. The first surface 261 of the second dielectric layer 26 is disposed on the second surface 222 of the first dielectric layer 22. One of the openings 264 extends fully through the second dielectric layer 26, and corresponds to the first pad 242. Each of the extending portions 263 is disposed in a respective first groove 223 defined by the first dielectric layer 22.

Each of the bump pads 40 is disposed in a respective opening 264 defined by the second dielectric layer 26 and on a respective first pad 242, and may protrude from the second dielectric layer 26. The bump pad 40 may include a plurality of metal layers. As shown in FIG. 1, the bump pad 40 includes a seed layer 30, a first metal layer 34, a second metal layer 36 and a third metal layer 38. The material of the first metal layer 34 may include, for example, copper, the material of the second metal layer 36 may include, for example, nickel, and the material of the third metal layer 38 may include, for example, gold. Other materials may additionally or alternatively be used for the metal layers. The first metal layer 34, the second metal layer 36 and the third metal layer 38 may be formed by sputtering and plating, and thus, can be made very thin. In one or more embodiments, the material of the third metal layer 38 may include, for example, tin, and the bump pad 40 may further include a silver layer on the tin layer. A bottom portion (including the seed layer 30 and the first metal layer 34) of the bump pad 40 in the opening 264 of the second dielectric layer 26 may be physically and electrically connected to the first pad 242.

The semiconductor die 3 is disposed on and electrically connected to the wiring structure 2. As shown in FIG. 1, the semiconductor die 3 is electrically connected to the first circuit layer 24 through the bump pads 40. Thus, the semiconductor die 3 is electrically connected to the conductive structure 203 of the main body 20 of the wiring structure 2 through the first circuit layer 24. In one or more embodiments, the semiconductor die 3 includes a plurality of metal pillars 32 and a plurality of solder connectors 33. The metal pillars 32 are connected to the bump pads 40 through the solder connectors 33 such that the semiconductor die 3 can be electrically connected to the first circuit layer 24.

The underfill 4 is disposed in the space between the semiconductor die 3 and the wiring structure 2 such that it covers and protects the bump pads 40, the solder connectors 33 and the metal pillars 32. The encapsulant 5, which may include, for example, a molding compound, covers at least a portion of one side surface of the semiconductor die 3, the underfill 4 and the second surface 262 of the second dielectric layer 26. In one embodiment, the encapsulant 5 covers the semiconductor die 3. That is, the top surface 51 of the encapsulant 5 is higher than the top surface 31 of the semiconductor die 3. However, in other embodiment, the top surface 51 of the encapsulant 5 may be substantially coplanar with the top surface 31 of the semiconductor die 3 such that heat from the semiconductor die 3 can be dissipated. In one or more embodiments, the underfill 4 may be omitted, and the encapsulant 5 may be disposed in the space between the semiconductor die 3 and the wiring structure 2 such that it covers and protects the bump pads 40, the solder connectors 33 and the metal pillars 32.

The external connection elements 12, which can be, for example, solder balls, are each disposed on the first surface 201 of the main body 20 for external connection. The external connection elements 12 are electrically connected to the conductive structure 203. In some embodiments, each of the external connection elements 12 has a substantially hemisphere shape.

In the embodiment illustrated in FIG. 1, the extending portions 263 of the second dielectric layer 26 are inserted or disposed in the first grooves 223 of the first dielectric layer 22. The extending portions 263 may be referred to as teeth that are engaged with the receiving portions 225 of the first dielectric layer 22. Therefore, the bonding area and bonding force between the second dielectric layer 26 and the first dielectric layer 22 are increased. As a result, the second dielectric layer 26 will not readily peel off or move horizontally.

Figure 2:
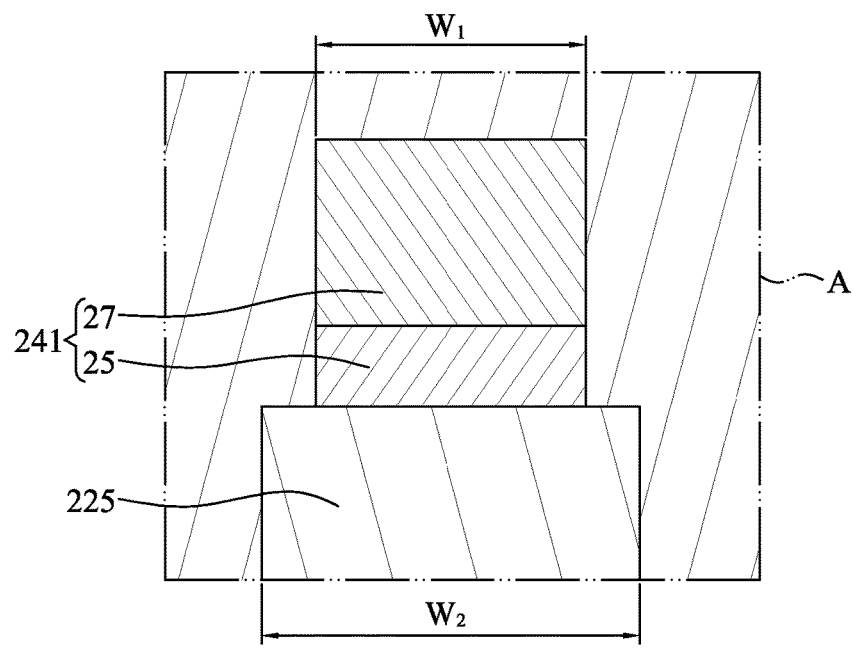
FIG. 2 illustrates an enlarged cross-sectional view of the region "A" of a semiconductor package structure shown in FIG. 1 according to some embodiments of the present disclosure.

FIG. 2 illustrates an enlarged cross-sectional view of the region "A" of a semiconductor package structure shown in FIG. 1 according to some embodiments of the present disclosure. A width of the metal material 27 is substantially equal to a width of the seed layer 25, both being equal to $W_1$. In addition, the width $W_1$ of the first conductive trace 241 (including the metal material 27 and the seed layer 25) is less than a width $W_2$ of the receiving portion 225.

Figure 3:
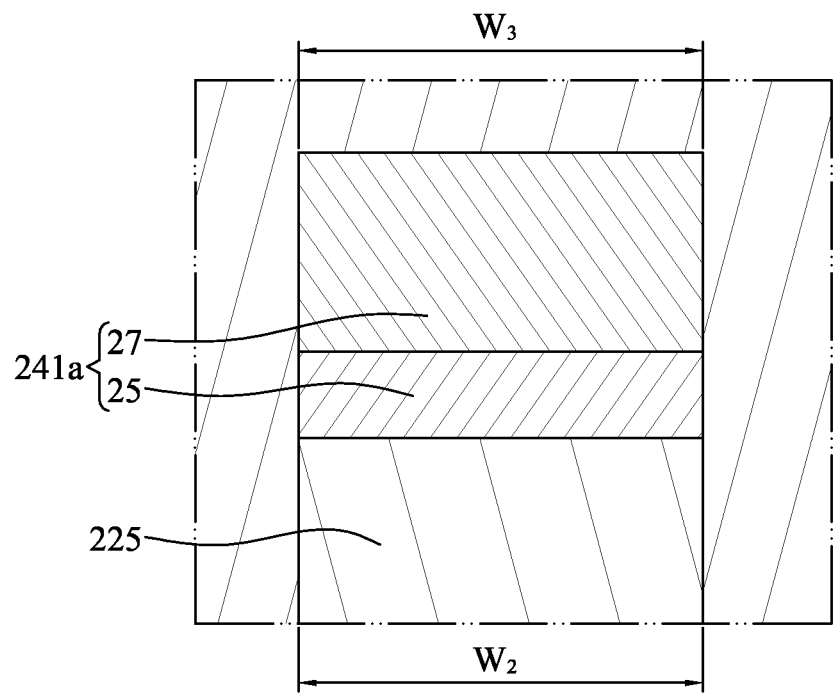
FIG. 3 illustrates an enlarged cross-sectional view of a region of a semiconductor package structure according to some embodiments of the present disclosure.

FIG. 3 illustrates an enlarged cross-sectional view of a region of a semiconductor package structure according to some embodiments of the present disclosure. A width of the metal material 27 is substantially equal to a width of the seed layer 25, both being equal to $W_3$. In addition, the width $W_3$ of the first conductive trace 241a (including the metal material 27 and the seed layer 25) is substantially equal to a width $W_2$ of the receiving portion 225.

Figure 4:
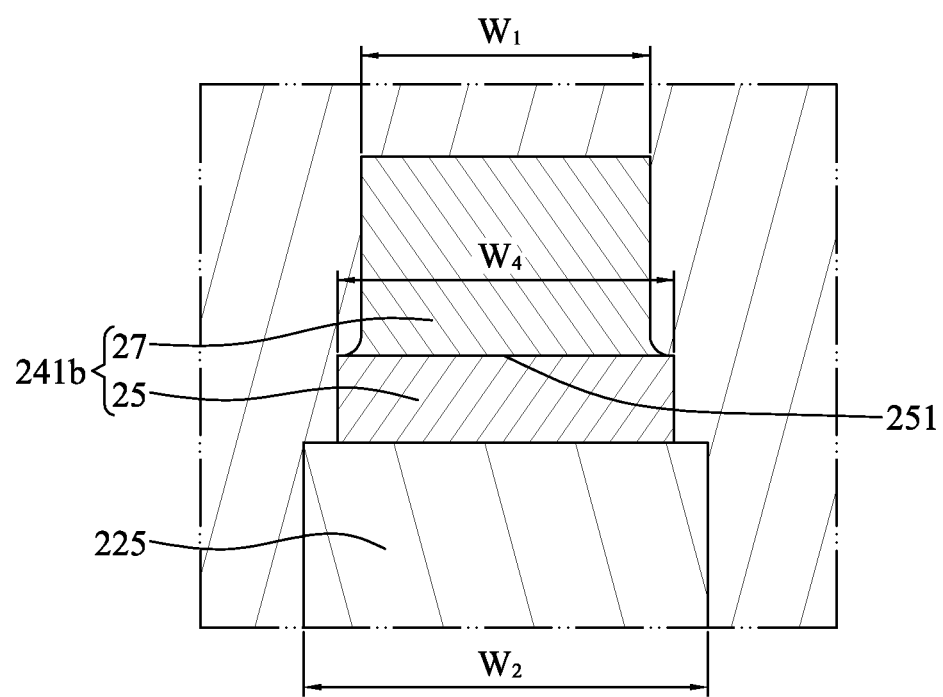
FIG. 4 illustrates an enlarged cross-sectional view of a region of a semiconductor package structure according to some embodiments of the present disclosure.

FIG. 4 illustrates an enlarged cross-sectional view of a region of a semiconductor package structure according to some embodiments of the present disclosure. In the first conductive trace 241b, a width $W_1$ of a main portion (e.g. a portion making up half or more, by volume) of the metal material 27 is less than a width $W_4$ of the seed layer 25, and the metal material 27 curves outward at a contacting surface 251 between the metal material 27 and the seed layer 25. The width $W_1$ of the main portion of the metal material 27 is less than a bottom portion of the metal material 27. In addition, the width $W_4$ of the seed layer 25 is less than a width $W_2$ of the receiving portion 225.

Figure 5:
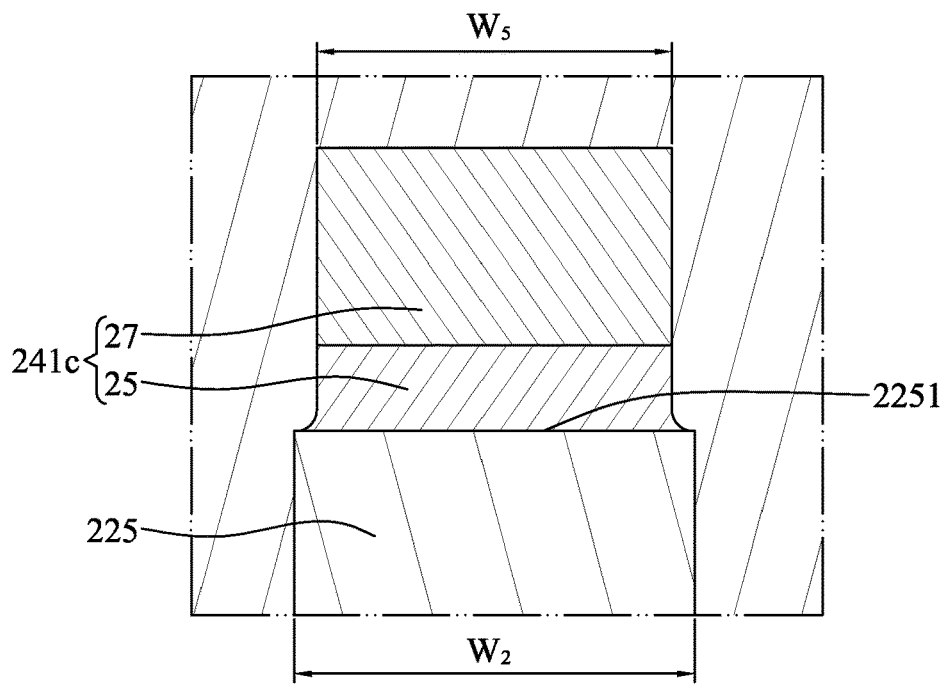
FIG. 5 illustrates an enlarged cross-sectional view of a region of a semiconductor package structure according to some embodiments of the present disclosure.

FIG. 5 illustrates an enlarged cross-sectional view of a region of a semiconductor package structure according to some embodiments of the present disclosure. In the first conductive trace 241c, a width of the metal material 27 is substantially equal to a width of the main portion of the seed layer 25, both being equal to $W_5$. That is, the width $W_5$ of the main portion of the seed layer 25 is less than the bottom portion of the seed layer 25. In addition, the first conductive trace 241c curves outward at a first surface 2251 between the first conductive trace 241c and the receiving portion 225. Further, the width $W_5$ of the metal material 27 is less than a width $W_2$ of the receiving portion 225.

Figure 6:
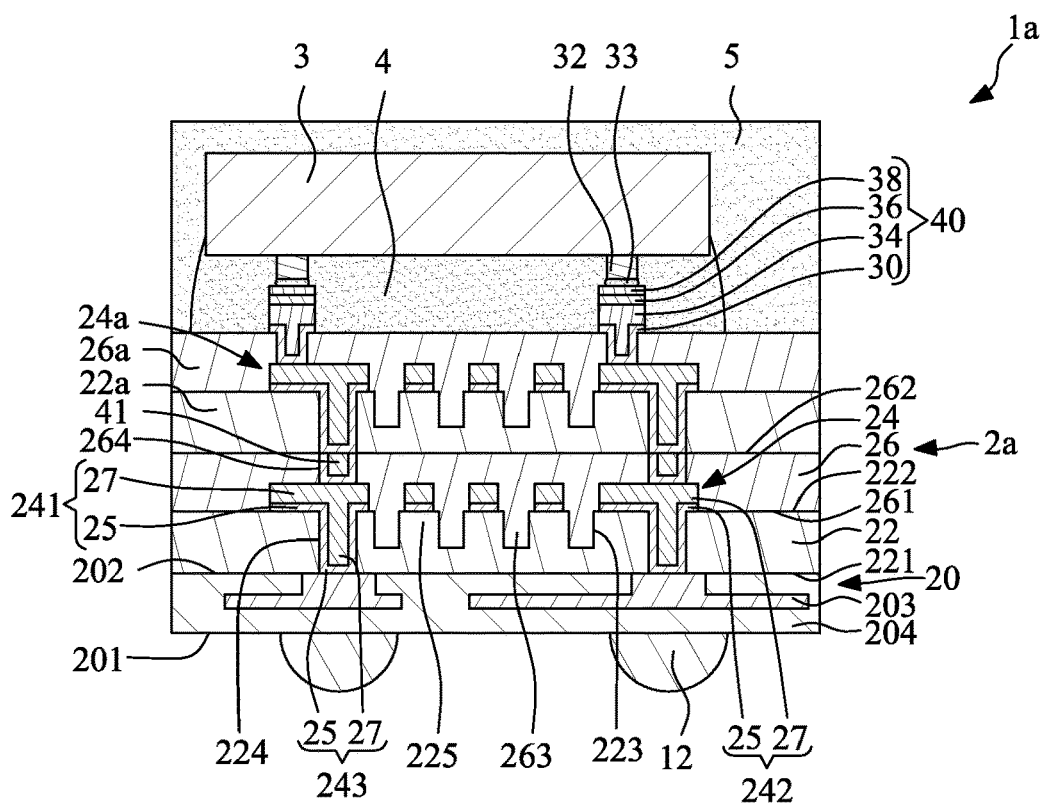
FIG. 6 illustrates a cross-sectional view of a semiconductor package structure according to some embodiments of the present disclosure.

FIG. 6 illustrates a cross-sectional view of a semiconductor package structure 1a according to some embodiments of the present disclosure. The semiconductor package structure 1a is similar in certain respects to the semiconductor package structure 1 as shown in FIG. 1, except for the structure of the wiring structure 2a. The wiring structure 2a further includes a third dielectric layer 22a, a second circuit layer 24a, a fourth dielectric layer 26a and a plurality of conductive vias 41. The third dielectric layer 22a, the second circuit layer 24a and the fourth dielectric layer 26a are similar to the first dielectric layer 22, the first circuit layer 24 and the second dielectric layer 26, respectively. The third dielectric layer 22a is disposed on the second dielectric layer 26. The second circuit layer 24a is disposed on and in the third dielectric layer 22a. The fourth dielectric layer 26a covers the second circuit layer 24a and the third dielectric layer 22a. Each of the conductive vias 41 is disposed in a respective opening 264 defined by the second dielectric layer 26 and on a respective first pad 242 such that it electrically connects the first circuit layer 24 and the second circuit layer 24a. A bottom portion of the bump pad 40 is disposed in the fourth dielectric layer 26a and is physically and electrically connected to the second circuit layer 24a.

Figure 7:
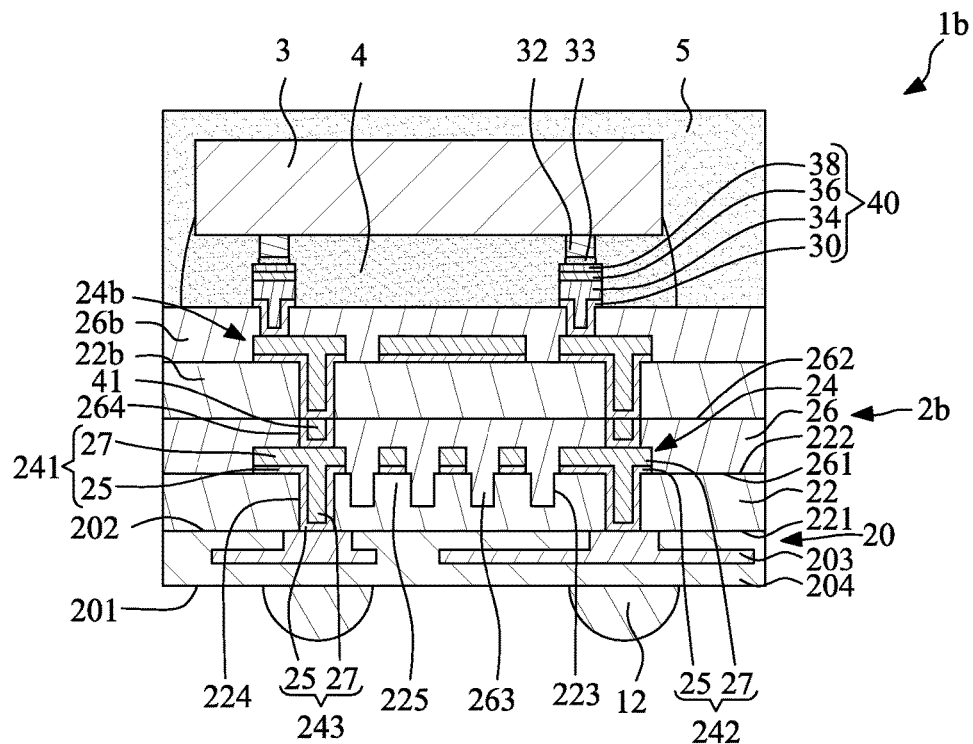
FIG. 7 illustrates a cross-sectional view of a semiconductor package structure according to some embodiments of the present disclosure.

FIG. 7 illustrates a cross-sectional view of a semiconductor package structure 1b according to some embodiments of the present disclosure. The semiconductor package structure 1b is similar in certain respects to the semiconductor package structure 1a as shown in FIG. 6, except for the structure of the wiring structure 2b. In the wiring structure 2b, the third dielectric layer 22b does not define any first grooves 223 of the first dielectric layer 22, and the third dielectric layer 22b has a substantially consistent thickness. Thus, the fourth dielectric layer 26b does not insert or extend into the third dielectric layer 22b. In addition, as shown in FIG. 7, the pattern of the second circuit layer 24b of the wiring structure 2b may be different from the pattern of the first circuit layer 24, although in some embodiments the pattern is the same.

Figure 8:
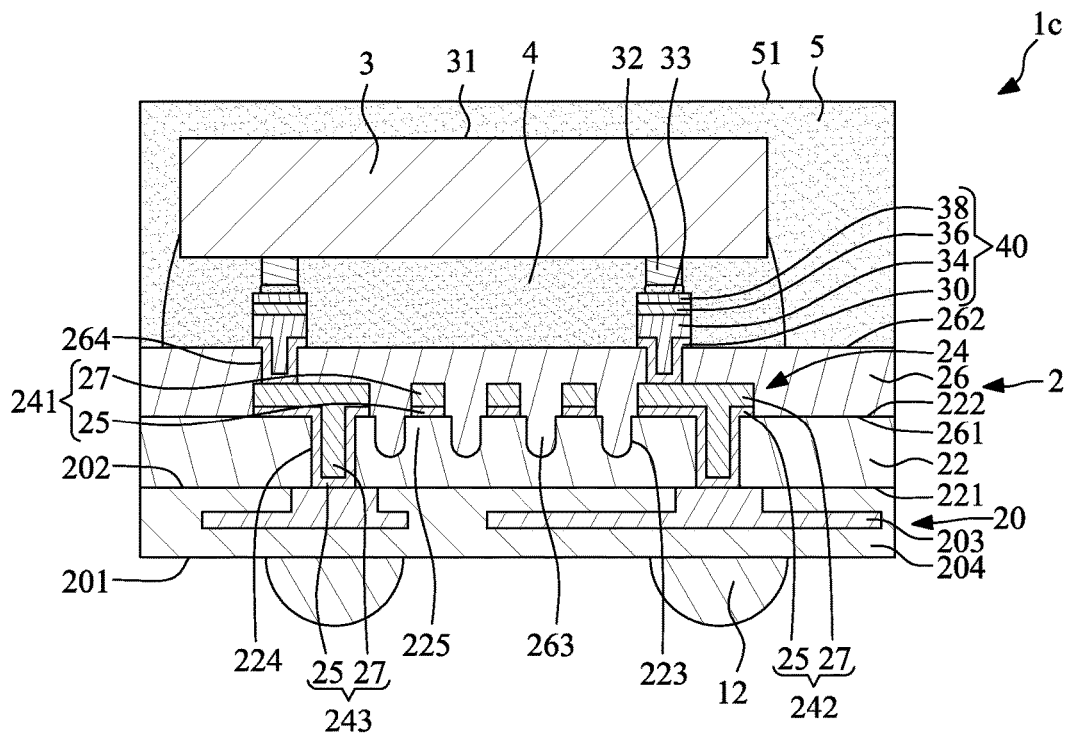
FIG. 8 illustrates a cross-sectional view of a semiconductor package structure according to some embodiments of the present disclosure.

FIG. 8 illustrates a cross-sectional view of a semiconductor package structure 1c according to some embodiments of the present disclosure. The semiconductor package structure 1c is similar in certain respects to the semiconductor package structure 1 as shown in FIG. 1, except that the bottom surface of at least one first groove 223 of the first dielectric layer 22 is a curved surface, such as a semicircular surface.

Figure 9:
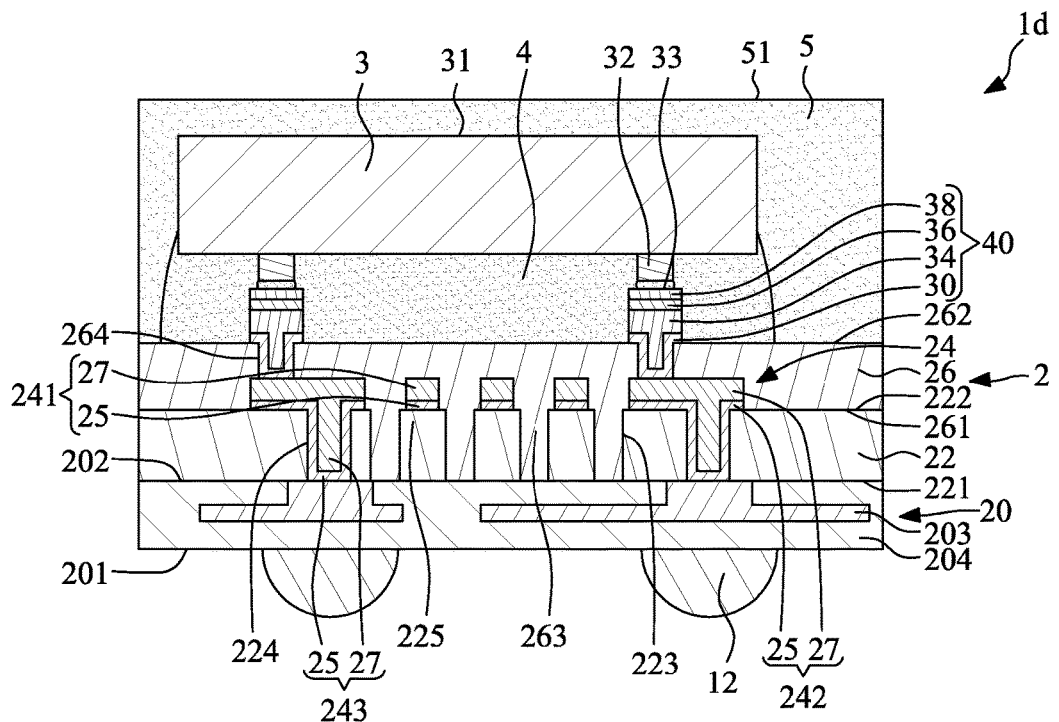
FIG. 9 illustrates a cross-sectional view of a semiconductor package structure according to some embodiments of the present disclosure.

FIG. 9 illustrates a cross-sectional view of a semiconductor package structure 1d according to some embodiments of the present disclosure. The semiconductor package structure 1d is similar in certain respects to the semiconductor package structure 1 as shown in FIG. 1, except that at least one of the first grooves 223 extends fully through the first dielectric layer 22.

Figure 10:
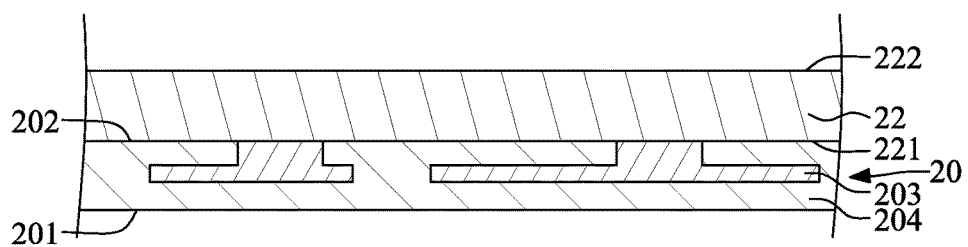
FIG. 10, FIG. 11, FIG. 12, FIG. 13, FIG. 14, FIG. 15, FIG. 16, FIG. 17, FIG. 18, FIG. 19, FIG. 20, FIG. 21, FIG. 22, FIG. 23, FIG. 24, FIG. 25 and FIG. 26 illustrate a semiconductor process for manufacturing a semiconductor package structure according to some embodiments of the present disclosure.

FIGS. 10-26 illustrate a semiconductor process for manufacturing a semiconductor package structure according to some embodiments of the present disclosure. Referring to FIG. 10, a first dielectric layer 22 is formed on a main body 20. The main body 20 (e.g., substrate) includes a first surface 201, a second surface 202 opposite to the first surface 201, a conductive structure 203 embedded in a dielectric structure 204. A portion of the conductive structure 203 is exposed from the first surface 201 of the main body 20. The L/S of the conductive structure 203 may be, for example, greater than about 5 μm/about 5 μm. The first dielectric layer 22 may be, for example, a passivation layer or a solder mask layer. In some embodiments, the first dielectric layer 22 may include, or be formed from, a cured PID material such as epoxy or PI including photoinitiators. The first dielectric layer 22 has a first surface 221 and a second surface 222 opposite to the first surface 221. The first surface 221 of the first dielectric layer 22 is disposed on the second surface 202 of the main body 20. The thickness of the first dielectric layer 22 may be about 6 μm to about 12 μm.

Then, a plurality of first grooves 223 (shown in FIG. 14) and at least one second groove 224 (shown in FIG. 14) are formed on the first dielectric layer 22. In some embodiments, the first grooves 223 and the second groove 224 are formed as follows.

Figure 11:
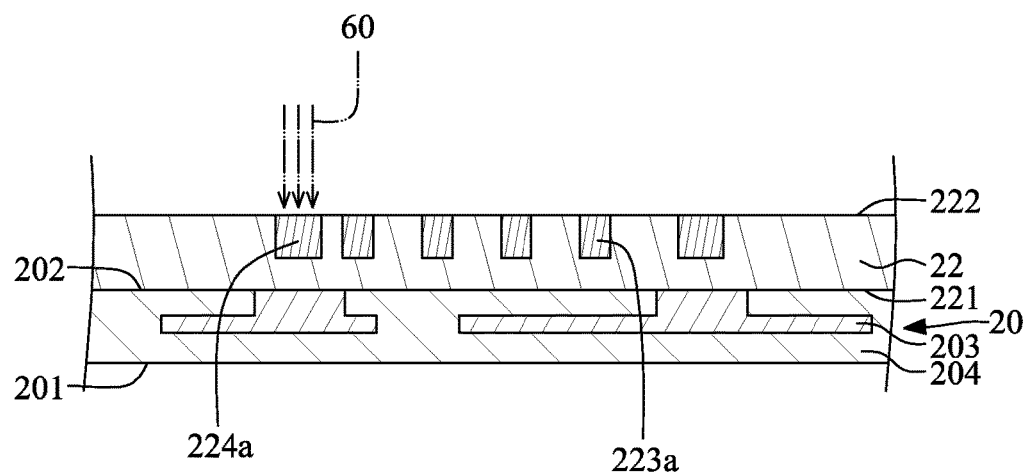

Referring to FIG. 11, a first laser 60 is applied to the second surface 222 of the first dielectric layer 22 and forms a plurality of first exposure zones 223a and at least one second exposure zone 224a. A material of the first exposure zones 223a and the second exposure zone 224a is different from the material of the first dielectric layer 22 due to a chemical reaction. The cross-sectional area of each of the first exposure zones 223a and the second exposure zone 224a is substantially equal to the cross-sectional area of the first laser 60. Such exposure method is referred herein as "laser direct imaging" (LDI). The depth of the first exposure zone 223a is substantially equal to the depth of the second exposure zone 224a.

Figure 12:
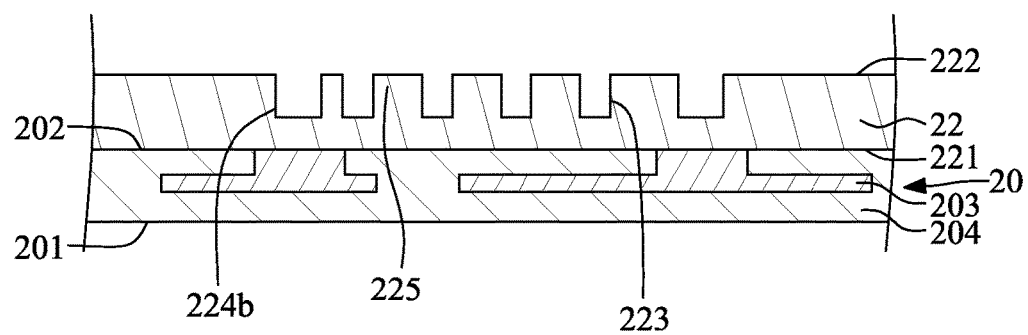

Referring to FIG. 12, a development process is performed such that the first exposure zones 223a are removed to form the first grooves 223, and the second exposure zone 224a is removed to form at least one cavity 224b. At least one receiving portion 225 is formed between and defined by two first grooves 223. The first grooves 223 are recesses from the second surface 222 of the first dielectric layer 22, and do not penetrate fully through the first dielectric layer 22. An aspect ratio of the first groove 223 may be greater than 0.1. For example, if a width of the first groove 223 is 2 μm, the depth of the first groove 223 must be greater than 0.2 μm. In one or more embodiments, a depth of the first groove 223 may be greater than ¼, ⅓ or ½ of a thickness of the first dielectric layer 22, or any number therebetween.

Figure 13:
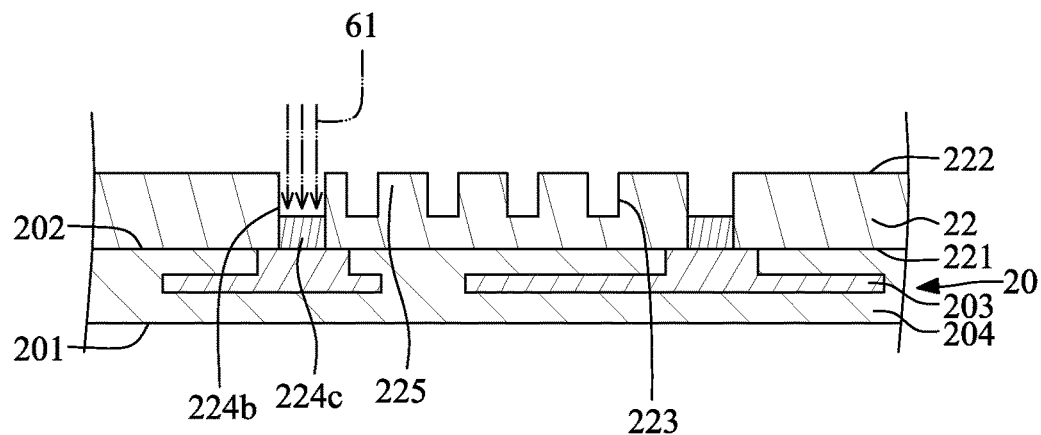

Referring to FIG. 13, a second laser 61 is applied to the cavity 224b to form at least one third exposure zone 224c. The second laser 61 is not applied to the first grooves 223. The type of the second laser 61 may be the same as or different from the type of the first laser 60. A material of the third exposure zone 224c is different from a material of the first dielectric layer 22 due to a chemical reaction. The cross-sectional area of the third exposure zone 224c is substantially equal to the cross-sectional area of the second laser 61.

Figure 14:
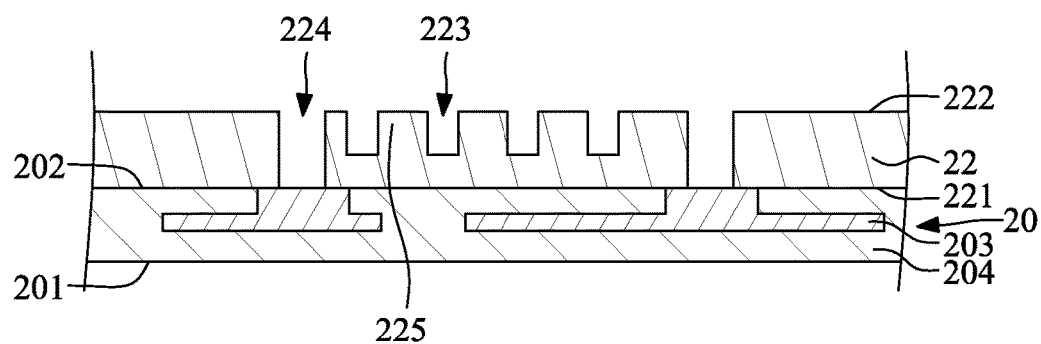

Referring to FIG. 14, a development process is performed such that the third exposure zones 224c are removed to form the second groove 224. As shown in FIG. 14, the second groove 224 extends fully through the first dielectric layer 22, and exposes a portion of the conductive structure 203. That is, a portion of the first dielectric layer 22 corresponding to the cavity 224b is removed through the cavity 224b to form the second groove 224.

Figure 15:
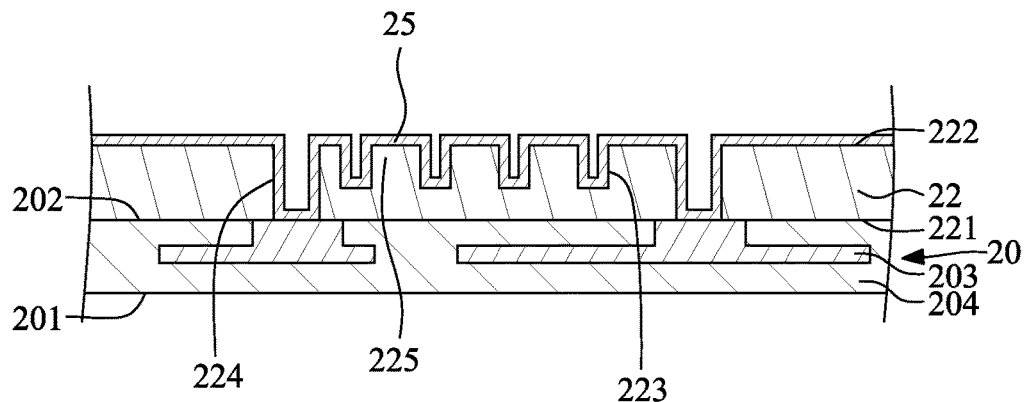

Referring to FIG. 15, a seed layer 25 is formed on the second surface 222 of the first dielectric layer 22 and in the first grooves 223 and the second groove 224 by, for example, sputtering. The thickness of the seed layer 25 may be about 0.3 μm to about 1 μm.

Figure 16:
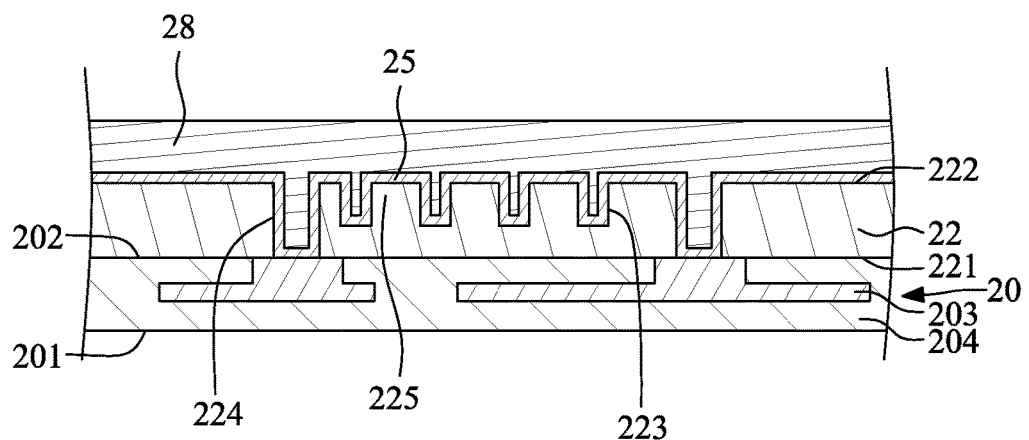

Referring to FIG. 16, an intermediate layer 28 (e.g., a photoresist layer) is formed on the seed layer 25 on the first dielectric layer 22 and in the first grooves 223 and the second groove 224 by, for example, coating.

Figure 17:
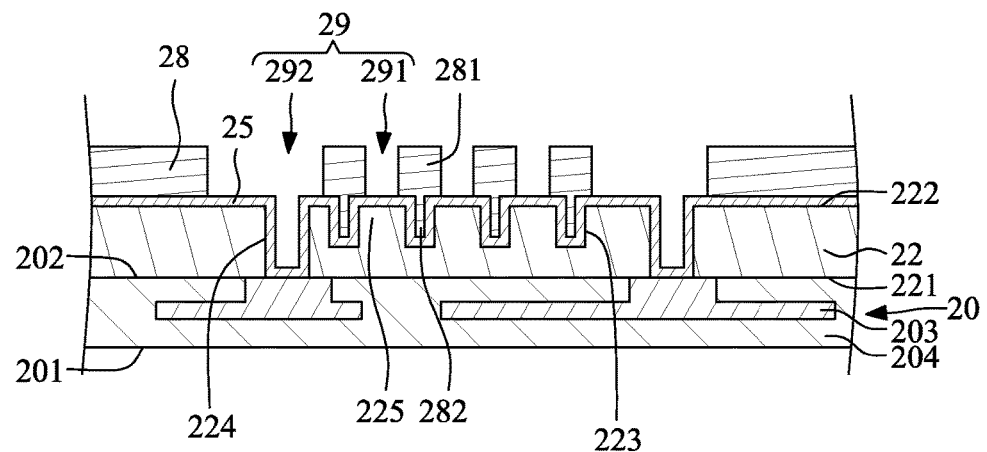

Referring to FIG. 17, a portion of the intermediate layer 28 is removed to form a pattern 29 by, for example, a lithography process. The pattern 29 includes at least one first opening 291 and at least one second opening 292. The first opening 291 is defined by at least in part by two first solid portions 281 of the intermediate layer 28. The first solid portion 281 of the intermediate layer 28 has an extending portion 282 extending into the first groove 223, and protrudes from the second surface 222 of the first dielectric layer 22. The first opening 291 corresponds to the receiving portion 225, and the second opening 292 exposes the seed layer 25 on the second surface 222 of the first dielectric layer 22 and in the second groove 224. As shown in FIG. 17, a width of the first opening 291 is less than a width of the receiving portion 225, and a width of the first solid portion 281 is greater than a width of the first groove 223.

In the embodiment illustrated in FIG. 17, the extending portion 282 of the first solid portion 281 of the intermediate layer 28 is inserted or disposed in the first groove 223 of the first dielectric layer 22. The extending portions 282 may be referred to as teeth that are engaged with the receiving portions 225 of the first dielectric layer 22. Therefore, the bonding area and bonding force between the intermediate layer 28 and the first dielectric layer 22 are increased. As a result, the intermediate layer 28 will not readily peel off or move horizontally, even if the L/S of the pattern 29 of the intermediate layer 28 is small, such as less than about 2 μm/about 2 μm. Further, if undercut occurs during a lithography process, the intermediate layer 28 can still firmly and stably stand on the seed layer 25 on the second surface 222 of the first dielectric layer 22.

Figure 18:
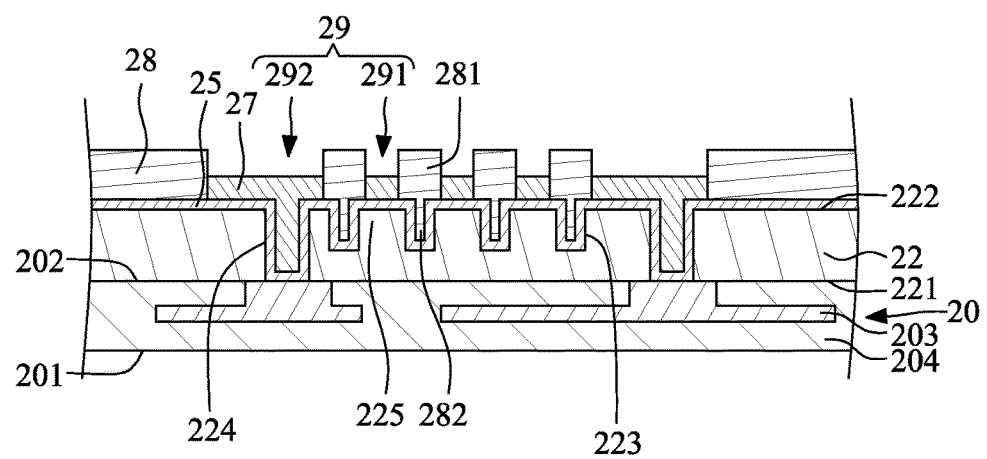

Referring to FIG. 18, a metal material 27 is formed on the seed layer 25 in the pattern 29 (including the first opening 291 and the second opening 292) and the second groove 224 by, for example, plating. The material of the metal material 27 may be, for example, copper.

Figure 19:
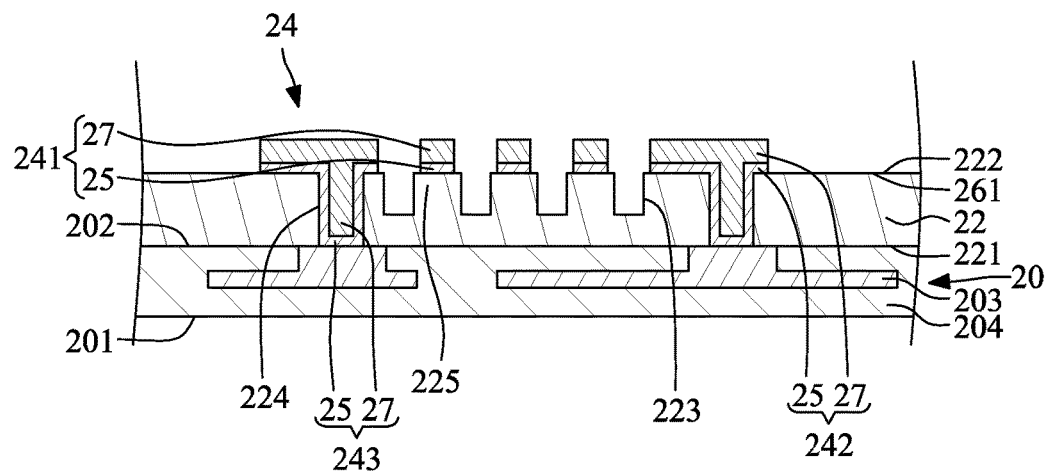

Referring to FIG. 19, the intermediate layer 28 is removed by, for example, stripping. Then, a portion of the seed layer 25 that is not covered by the metal material 27 is removed by, for example, etching, so as to form a first circuit layer 24. The first circuit layer 24 includes at least one first conductive trace 241, at least one first pad 242 and at least one first conductive via 243. The first conductive trace 241 is disposed on the receiving portion 225. As shown in FIG. 19, the first conductive trace 241 includes the metal material 27 and the seed layer 25 that are disposed in the first opening 291 (shown in FIG. 18) of the pattern 29. The seed layer 25 is disposed on the receiving portion 225, and the metal material 27 is disposed on the seed layer 25. A L/S of the first conductive trace 241 may be less than about 2 μm/about 2 μm. The first pad 242 includes the metal material 27 and the seed layer 25 that are disposed in the second opening 292 (shown in FIG. 18) of the pattern 29. The first conductive via 243 includes the metal material 27 and the seed layer 25 that are disposed in the second groove 224, and physically and electrically connects the first pad 242 and a portion of the conductive structure 203 of the main body 20. In one or more embodiments, the first conductive trace 241, the first pad 242 and the first conductive via 243 are formed concurrently. In addition, a width of the first conductive trace 241 is less than a width of the receiving portion 225.

As stated above, the intermediate layer 28 will not readily peel off, thus, the first conductive trace 241 of the first circuit layer 24 can stand on the first dielectric layer 22 securely even if a width of first conductive trace 241 is 2 μm or less. In addition, the surface roughness of the second surface 222 of the first dielectric layer 22 will have less influence on the stability of the first circuit layer 24.

Figure 20:
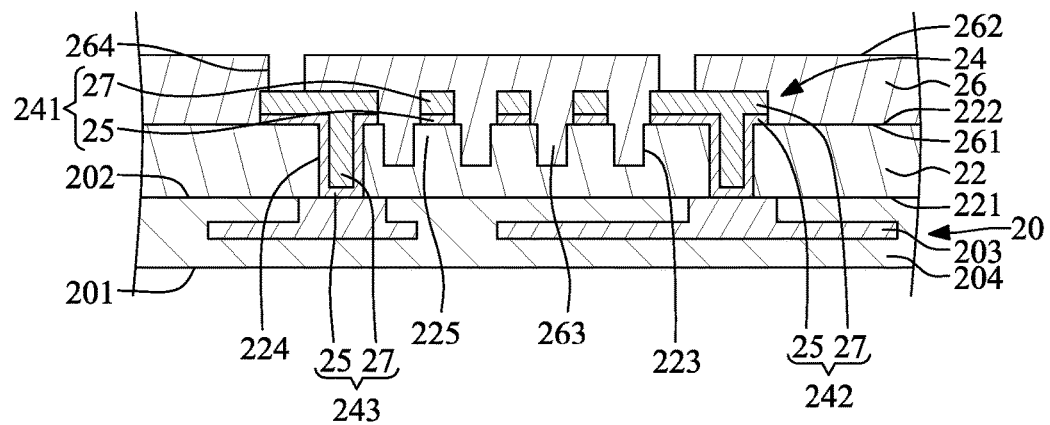

Referring to FIG. 20, the second dielectric layer 26 is formed on the first dielectric layer 22 and covers the first conductive trace 241 and the first pad 242 of the first circuit layer 24, and extends into the first grooves 223 of the first dielectric layer 22. The second dielectric layer 26 may be, for example, a passivation layer or a solder mask layer. In some embodiments, the second dielectric layer 26 may include, or be formed from, a cured PID material such as epoxy or PI including photoinitiators. The material of the second dielectric layer 26 may be the same as or different from the material of the first dielectric layer 22. The second dielectric layer 26 has a first surface 261, a second surface 262 opposite to the first surface 261 and a plurality of extending portions 263, and defines a plurality of openings 264. The first surface 261 of the second dielectric layer 26 is disposed on the second surface 222 of the first dielectric layer 22. The opening 264 extends through the second dielectric layer 26, and corresponds to the first pad 242. Each of the extending portions 263 is disposed in a respective first groove 223 defined by the first dielectric layer 22.

In the embodiments illustrated in FIG. 20, the extending portions 263 of the second dielectric layer 26 are inserted or disposed in the first grooves 223 of the first dielectric layer 22. The extending portions 263 may be referred to as teeth that are engaged with the receiving portions 225 of the first dielectric layer 22. Therefore, the bonding area and bonding force between the second dielectric layer 26 and the first dielectric layer 22 are increased. As a result, the second dielectric layer 26 will not readily peel off or move horizontally.

Figure 21:
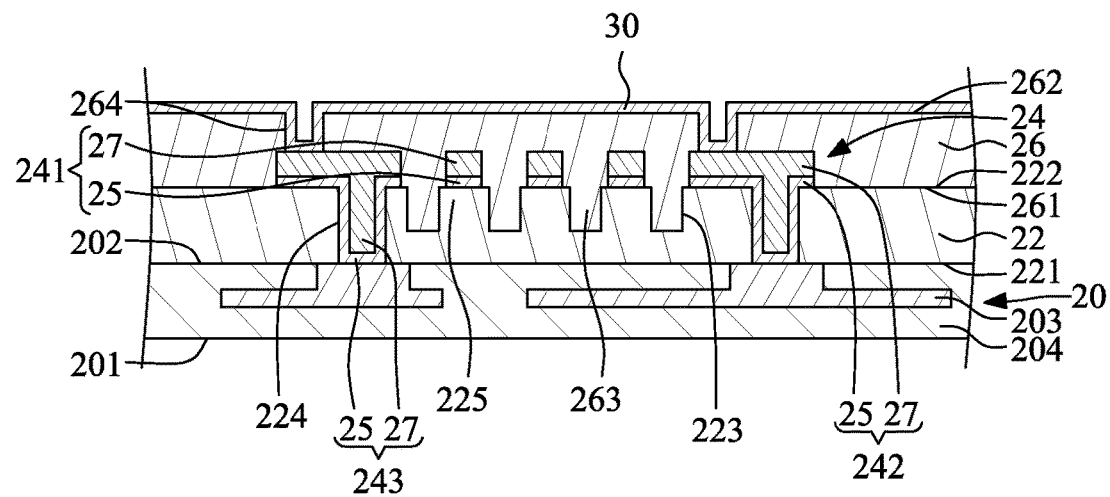

Referring to FIG. 21, a seed layer 30 is formed on the second surface 262 of the second dielectric layer 26 and in the opening 264.

Figure 22:
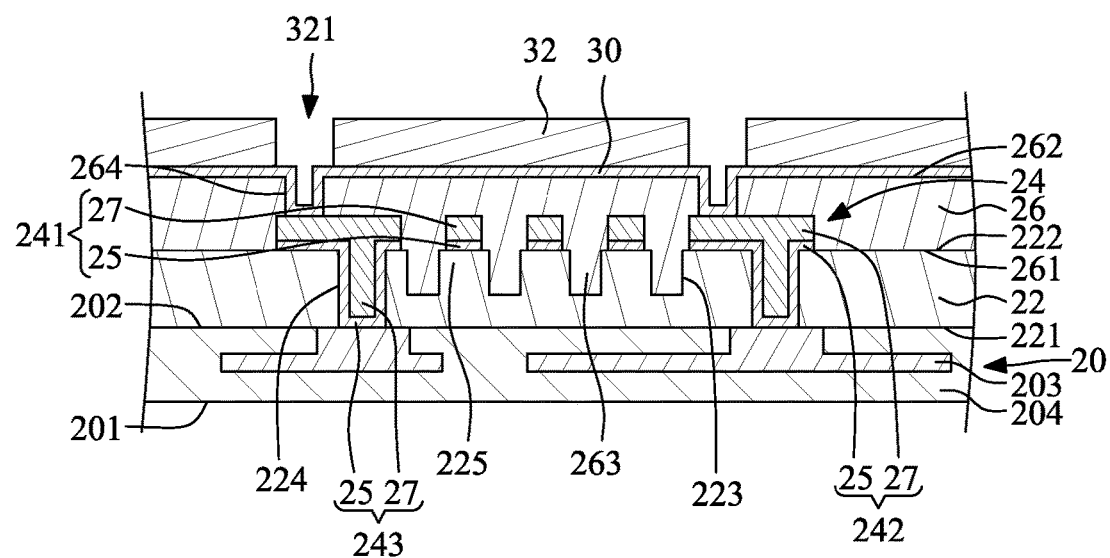

Referring to FIG. 22, an intermediate layer 32 (e.g., a photoresist layer) is formed on the seed layer 30 on the second dielectric layer 26 by, for example, coating. Then, a portion of the intermediate layer 32 is removed to form at least one opening 321 by, for example, a lithography process. The location of the opening 321 of the intermediate layer 32 corresponds to the location of the opening 264 of the second dielectric layer 26.

Figure 23:
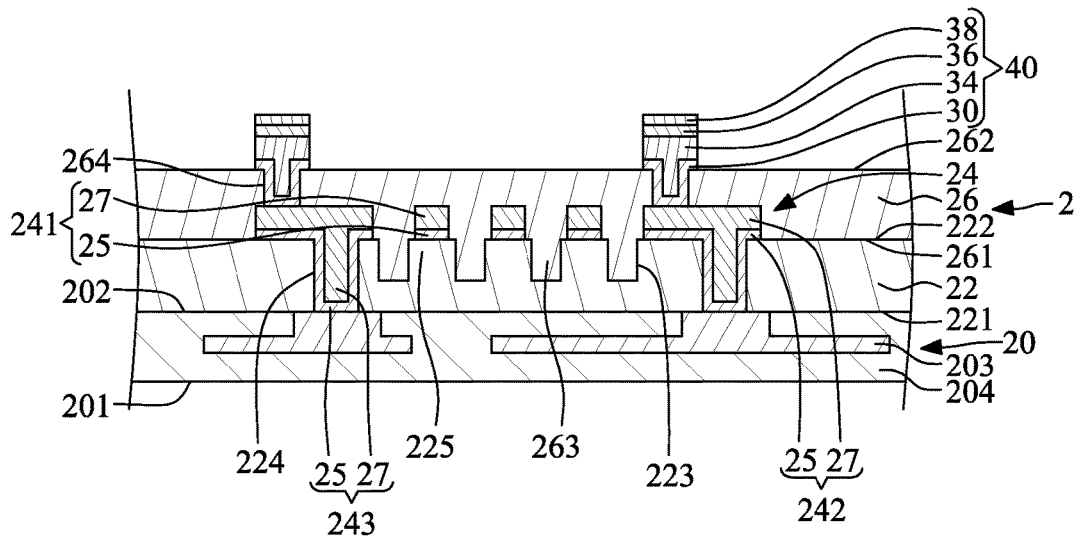

Referring to FIG. 23, a first metal layer 34, a second metal layer 36 and a third metal layer 38 are formed on the seed layer 30 in the opening 321 of the intermediate layer 32 and in the opening 264 of the second dielectric layer 26. Then, the intermediate layer 32 is removed by, for example, stripping. Then, a portion of the seed layer 30 that is not covered by the first metal layer 34, the second metal layer 36 and the third metal layer 38 is removed by, for example, etching, so as to form a bump pad 40. As shown in FIG. 23, the bump pad 40 is disposed in a respective opening 264 defined by the second dielectric layer 26 and on a respective first pad 242, and may protrude from the second dielectric layer 26. The bump pad 40 includes the seed layer 30, the first metal layer 34, the second metal layer 36 and the third metal layer 38. The material of the first metal layer 34 may include, for example, copper, the material of the second metal layer 36 may include, for example, nickel, and the material of the third metal layer 38 may include, for example, gold. Other materials may additionally or alternatively be used for the metal layers. The first metal layer 34, the second metal layer 36 and the third metal layer 38 are formed by sputtering and plating, and thus, they can be made very thin. In one or more embodiments, the material of the third metal layer 38 may include, for example, tin, and the bump pad 40 may further include a silver layer on the tin layer. A bottom portion (including the seed layer 30 and the first metal layer 34) of the bump pad 40 in the opening 264 of the second dielectric layer 26 may be physically and electrically connected to the first pad 242. Thus, a wiring structure 2 which includes the main body 20, the first dielectric layer 22, the first circuit layer 24, the second dielectric layer 26 and the plurality of bump pads 40 is formed.

Figure 24:
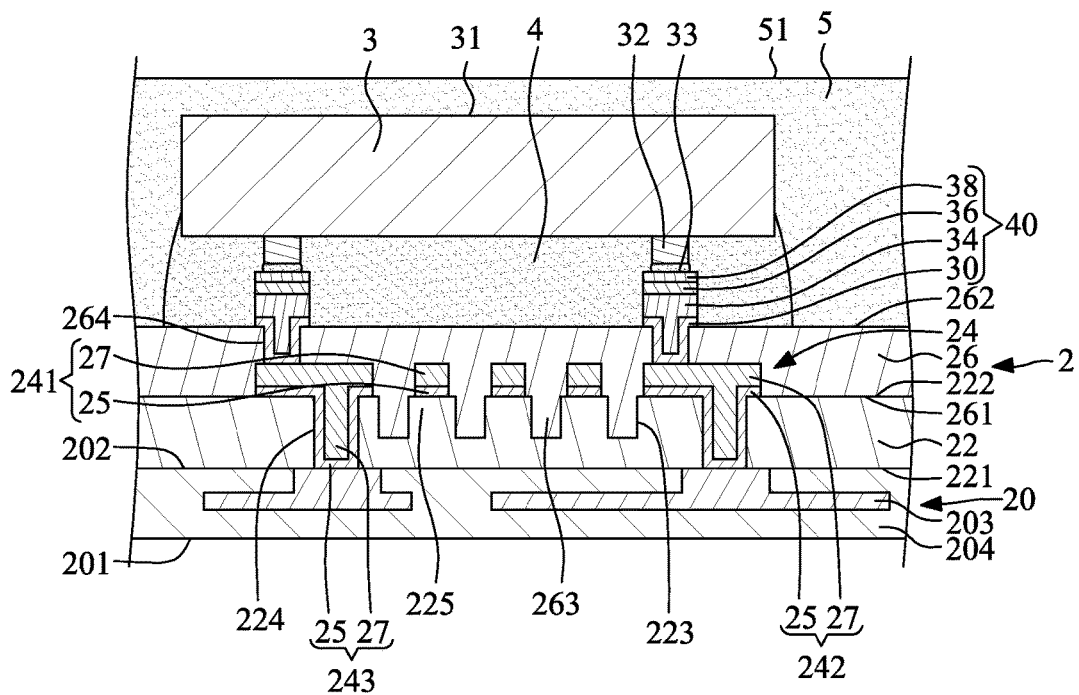

Referring to FIG. 24, a semiconductor die 3 is attached and electrically connected to the wiring structure 2. As shown in FIG. 24, the semiconductor die 3 is electrically connected to the first circuit layer 24 through the bump pads 40. Thus, the semiconductor die 3 is electrically connected to the conductive structure 203 of the main body 20 of the wiring structure 2 through the first circuit layer 24. In one or more embodiments, the semiconductor die 3 includes a plurality of metal pillars 32 and a plurality of solder connectors 33. The metal pillars 32 are connected to the bump pads 40 through the solder connectors 33 such that the semiconductor die 3 can be electrically connected to the first circuit layer 24.

An underfill 4 is optionally disposed in the space between the semiconductor die 3 and the wiring structure 2 such that it covers and protects the bump pads 40, the solder connectors 33 and the metal pillars 32. An encapsulant 5, which may include, for example, a molding compound, covers at least a portion of one side surface of the semiconductor die 3, the underfill 4 and the second surface 262 of the second dielectric layer 26. In one embodiment, the encapsulant 5 covers the semiconductor die 3. That is, the top surface 51 of the encapsulant 5 is higher than the top surface 31 of the semiconductor die 3. However, in other embodiment, the top surface 51 of the encapsulant 5 may be substantially coplanar with the top surface 31 of the semiconductor die 3 such that heat from the semiconductor die 3 can be dissipated. In one or more embodiments, the underfill 4 may be omitted, and the encapsulant 5 may be disposed in the space between the semiconductor die 3 and the wiring structure 2 such that it covers and protects the bump pads 40, the solder connectors 33 and the metal pillars 32.

Figure 25:
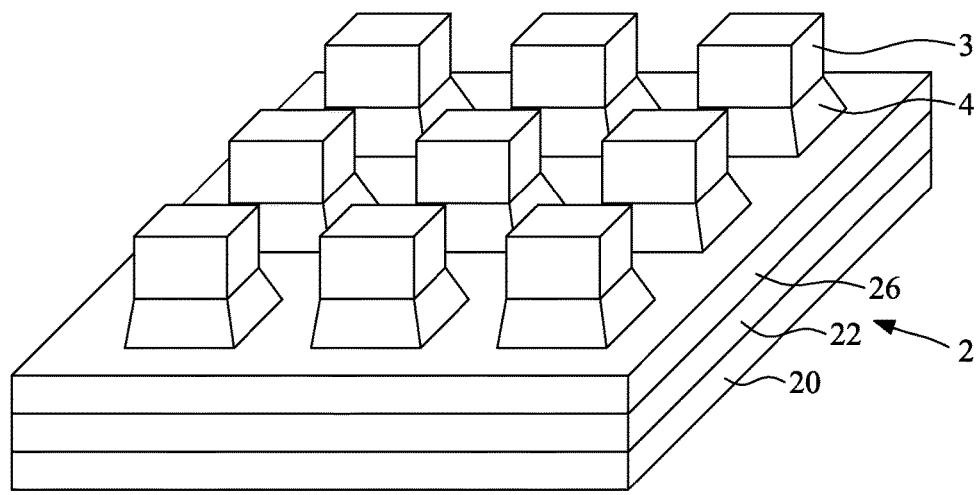

FIG. 25 illustrates a schematic perspective view of the wiring structure 2 and a plurality of semiconductor dice 3 depicted in FIG. 24 in which the encapsulant 5 is omitted, according to some embodiments of the present disclosure. A surface of the wiring structure 2 may be rectangular or square.

Figure 26:
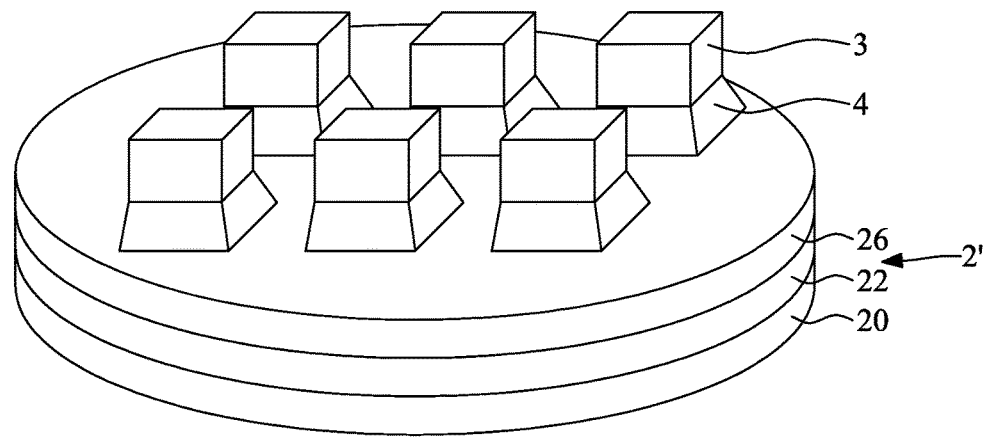

FIG. 26 illustrates a schematic perspective view of the wiring structure 2' and the semiconductor dice 4 depicted in FIG. 24 in which the encapsulant 5 is omitted, according to some embodiments of the present disclosure. A surface of the wiring structure 2' may be circular or elliptical.

Then, a plurality of external connection elements 12, which can be, for example, solder balls, are each formed on the first surface 201 of the main body 20 for external connection. Then, singulation is performed to form a plurality of semiconductor package structures 1 as shown in FIG. 1.

Figure 27:
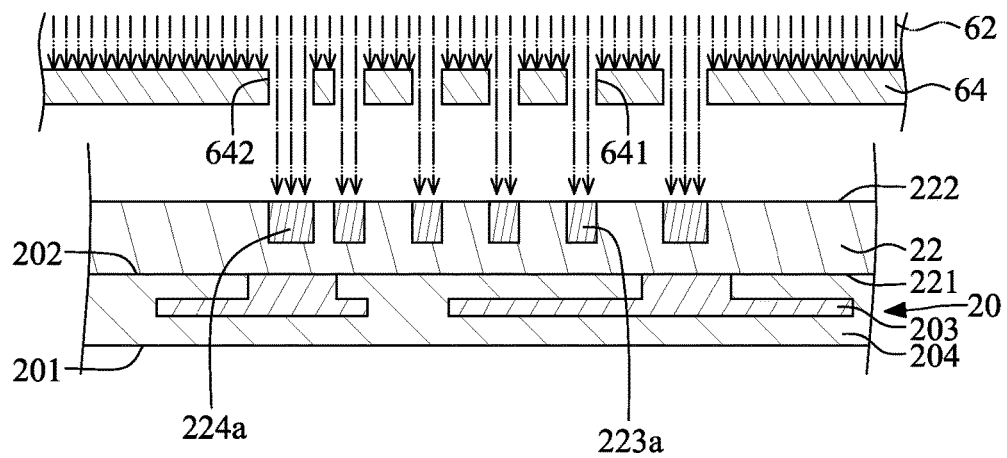
FIG. 27, FIG. 28 and FIG. 29 illustrate a semiconductor process according to some embodiments of the present disclosure.
Figure 28:
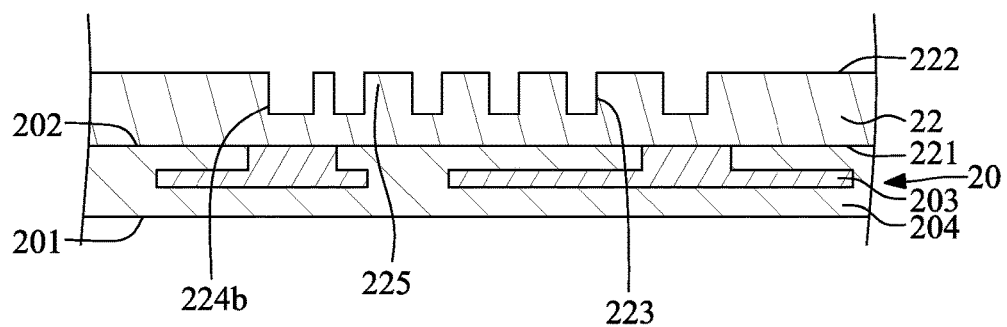
Figure 29:
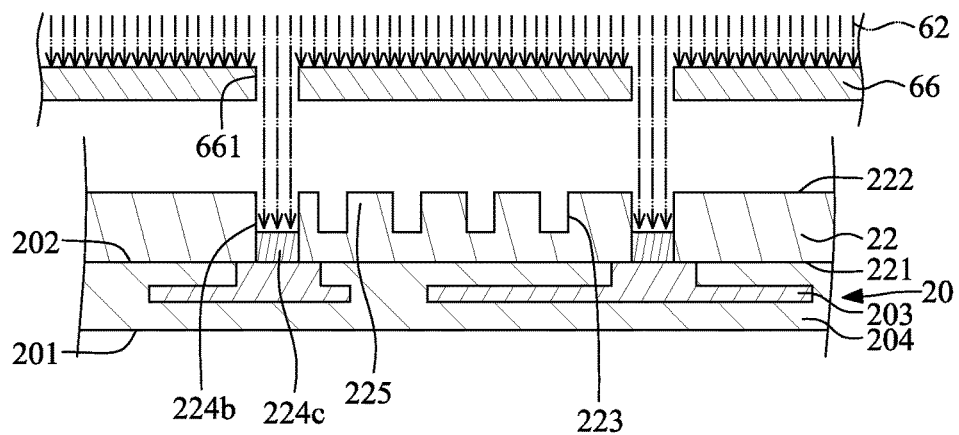

FIGS. 27-29 illustrate a semiconductor process according to some embodiments of the present disclosure. The initial stage of the illustrated process is similar to the stage illustrated in FIG. 10. The stage illustrated in FIG. 27 is subsequent to that illustrated in FIG. 10. Referring to FIG. 27, a light beam 62 with large area is applied to the second surface 222 of the first dielectric layer 22 through a first mask 64 to form the first exposure zones 223a and the second exposure zone 224a. A material of the first exposure zones 223a and the second exposure zone 224a is different from a material of the first dielectric layer 22 due to a chemical reaction. The first mask 64 defines a plurality of first through holes 641 and at least one second through hole 642. The cross-sectional area of each of the first exposure zones 223a is substantially equal to the cross-sectional area of each of the through holes 641, and the cross-sectional area of the second exposure zone 224a is substantially equal to the cross-sectional area of the second through hole 642. The depth of the first exposure zone 223a is substantially equal to the depth of the second exposure zone 224a.

Referring to FIG. 28, a development process is performed such that the first exposure zones 223a are removed to form the first grooves 223, and the second exposure zone 224a is removed to form at least one cavity 224b, as shown in FIG. 12.

Referring to FIG. 29, the light beam 62 is applied to the cavity 224b through a second mask 66 to form at least one third exposure zone 224c. The second mask 66 defines at least one through hole 661 corresponding to the cavity 224b. The light beam 62 is not applied to the first grooves 223. A material of the third exposure zone 224c is different from a material of the first dielectric layer 22 due to a chemical reaction. A cross-sectional area of the third exposure zone 224c is substantially equal to a cross-sectional area of the through hole 661.

Then, the following stages of the illustrated process are similar to the stages illustrated in FIGS. 14-26 so as to form a plurality of semiconductor package structures 1 as shown in FIG. 1.

Figure 30:
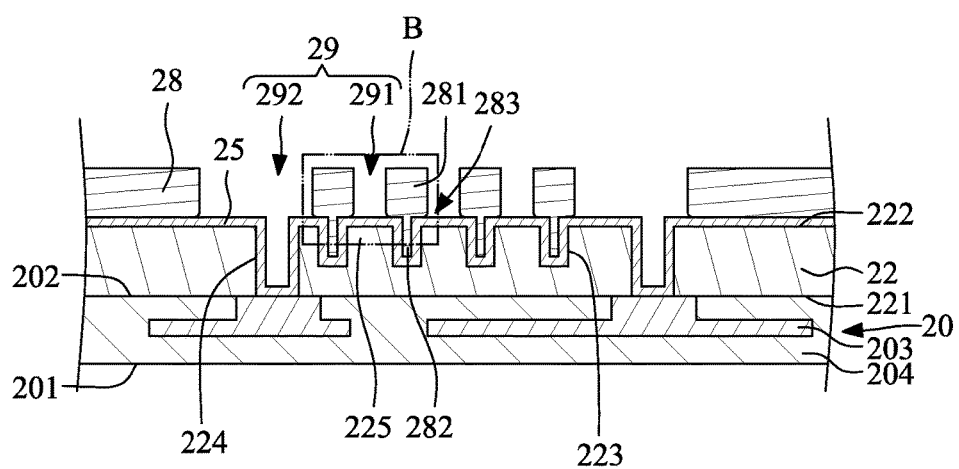
FIG. 30, FIG. 31, FIG. 32 and FIG. 33 illustrate a semiconductor process according to some embodiments of the present disclosure.
Figure 31:
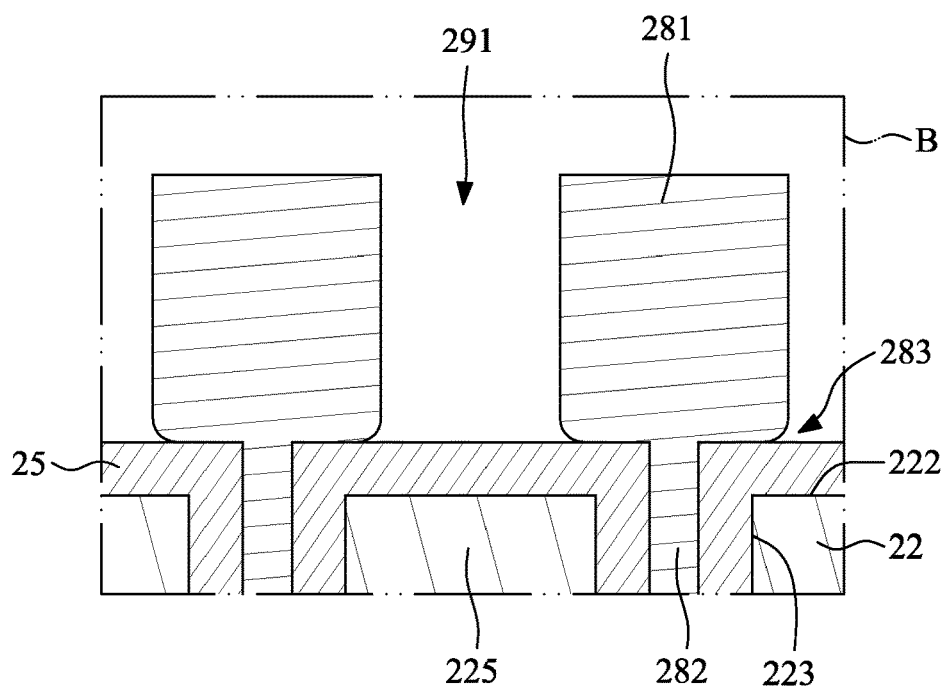

FIGS. 30-33 illustrate a semiconductor process according to some embodiments of the present disclosure. The initial stages of the illustrated process is similar to the stages illustrated in FIGS. 10-16. The stage illustrated in FIG. 30 is subsequent to the stage illustrated in FIG. 16. Referring to FIGS. 30 and 31, in which FIG. 31 illustrates an enlarged view of an area "B" depicted in FIG. 30, undercut occurs at the corner 283 between the first solid portion 281 of the intermediate layer 28 and the seed layer 25. That is, a bottom portion of the first solid portion 281 of the intermediate layer 28 is removed in excess of a desired amount during a lithography process. Thus, a width of a bottom portion of the first solid portion 281 of the intermediate layer 28 is less than a width of a top portion of the first solid portion 281 of the intermediate layer 28. The corner 283 of the first solid portion 281 may be in an arc-shape. As discussed above, the extending portion 282 of the first solid portion 281 of the intermediate layer 28 is inserted or disposed into the first groove 223 of the first dielectric layer 22, and thus, the intermediate layer 28 can stably stand on the seed layer 25 on the second surface 222 of the first dielectric layer 22 firmly even when "undercut" occurs during a lithography process.

Figure 32:
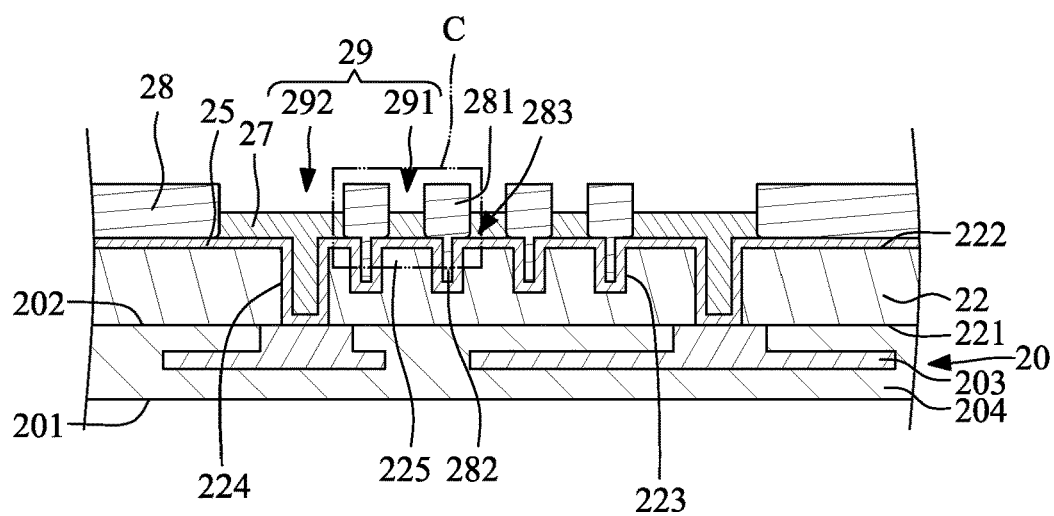
Figure 33:
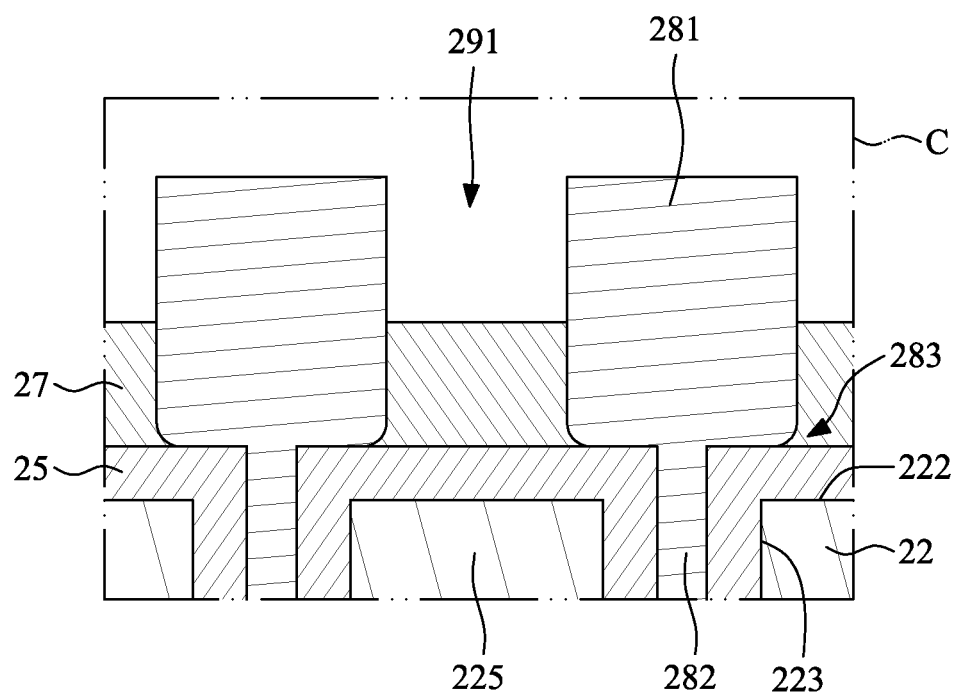

Referring to FIGS. 32 and 33, in which FIG. 33 illustrates an enlarged view of an area "C" depicted in FIG. 32, the metal material 27 is formed on the seed layer 25 in the pattern 29 (including the first opening 291 and the second opening 292) and the second groove 224 by, for example, plating, as shown in FIG. 18.

Then, the intermediate layer 28 is removed by, for example, stripping. Then, a portion of the seed layer 25 that is not covered by the metal material 27 is removed by, for example, etching, so as to form a first circuit layer 24, as shown in FIG. 19. It is noted that the first circuit layer 24 includes at least one first conductive trace 241b as shown in FIG. 4.

Then, the following stages of the illustrated process are similar to the stages illustrated in FIGS. 19-26.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated by such an arrangement.

As used herein, the singular terms "a," "an," and "the" may include plural referents unless the context clearly dictates otherwise.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 µm, no greater than 2 µm, no greater than 1 µm, or no greater than 0.5 µm.

In the description of some embodiments, a component provided "on" or "over" another component can encompass cases where the former component is directly on (e.g., in physical contact with) the latter component, as well as cases where one or more intervening components are located between the former component and the latter component.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A wiring structure, comprising:
   a main body including a conductive structure;
   a first dielectric layer disposed on the main body, and defining a plurality of first grooves and at least one receiving portion between two first grooves;
   a circuit layer disposed on the first dielectric layer, and including at least one conductive trace disposed on the receiving portion, a width of the conductive trace being less than a width of the receiving portion; and
   a second dielectric layer disposed on the first dielectric layer, and extending into the first grooves,
   wherein the first dielectric layer further defines at least one second groove extending fully through the first dielectric layer, the circuit layer further includes at least one pad and at least one conductive via, the pad is disposed on the first dielectric layer and above the second groove, and the conductive via is disposed in the second groove and connects the pad and a portion of the conductive structure of the main body.

2. The wiring structure of claim 1, wherein a line width/line space of the first conductive trace is less than about 2 µm/about 2 µm.

3. The wiring structure of claim 1, wherein an aspect ratio of the first groove is greater than 0.1.

4. The wiring structure of claim 1, wherein the first grooves extend fully through the first dielectric layer.

5. The wiring structure of claim 1, wherein the first dielectric layer is cured from a photoimageable dielectric material.

6. The wiring structure of claim 1, wherein the conductive trace curves outward at a first surface between the conductive trace and the receiving portion.

7. The wiring structure of claim 1, wherein the conductive trace includes a metal material and a seed layer, the seed layer is disposed on the receiving portion, the metal material is disposed on the seed layer, and the metal material curves outward at a contacting surface between the metal material and the seed layer.

8. A semiconductor package structure, comprising:
   a wiring structure, comprising:
      a main body including a conductive structure;
      a first dielectric layer disposed on the main body, and defining a plurality of first grooves and at least one receiving portion between two first grooves;
      a circuit layer disposed on the first dielectric layer, and including at least one conductive trace disposed on the receiving portion, a width of the conductive trace being less than a width of the receiving portion; and
      a second dielectric layer disposed on the first dielectric layer, and extending into the first grooves; and
   a semiconductor die disposed on and electrically connected to the wiring structure,
   wherein the first dielectric layer further defines at least one second groove extending fully through the first dielectric layer, the circuit layer further includes at least one pad and at least one conductive via, the pad is disposed on the first dielectric layer and above the second groove, and the conductive via is disposed in the second groove and connects the pad and a portion of the conductive structure of the main body.

9. The semiconductor package structure of claim 8, wherein the semiconductor die is electrically connected to the conductive structure of the main body of the wiring structure through the circuit layer.

10. The semiconductor package structure of claim 8, further comprising an encapsulant covering the semiconductor die.

11. A wiring structure, comprising:
a main body including a conductive structure;
a first dielectric layer disposed on the main body, and defining a plurality of first grooves;
a circuit layer disposed on the first dielectric layer; and
a second dielectric layer disposed on the first dielectric layer, the second dielectric layer comprising a plurality of extending portions that respectively extend into at least some of the first grooves of the plurality of first grooves,
wherein the first dielectric layer further defines at least one second groove extending fully through the first dielectric layer, the circuit layer includes at least one pad and at least one conductive via, the pad is disposed on the first dielectric layer and above the second groove, and the conductive via is disposed in the second groove and connects the pad and a portion of the conductive structure of the main body.

12. The wiring structure of claim 11, wherein the at least some first grooves extend fully through the first dielectric layer, and the extending portions of the second dielectric layer extend through the first grooves to contact the main body.

13. The wiring structure of claim 11, wherein the main body comprises a dielectric structure and the conductive structure embedded in the dielectric structure.

14. The wiring structure of claim 13, wherein the main body has a surface on which the first dielectric layer is disposed, and a portion of the conductive structure of the main body is exposed from the surface.

15. The wiring structure of claim 14, wherein the at least some first grooves extend fully through the first dielectric layer, and the extending portions of the second dielectric layer extend through the first grooves to contact the surface away from the exposed portion of the conductive structure.

16. The wiring structure of claim 15, wherein the circuit layer extends through the second groove to contact the exposed portion of the conductive structure of the main body.

17. The wiring structure of claim 13, wherein the conductive structure has a line width/line space of about 5 µm/about 5 µm.

18. The wiring structure of claim 11, wherein each of the first grooves has a curved bottom surface.

19. The wiring structure of claim 11, wherein the first dielectric layer has a thickness, and the first grooves extend to a depth greater than one-quarter of the thickness of the first dielectric layer.

\* \* \* \* \*